UHF-VHF CHANNEL INDICATING DEVICE

Filed Dec. 2, 1966 2 Sheets-Sheet 1

INVENTORS:
DONALD J. SIEBOLD,
MICHAEL L. CALLAHAN,

BY W. J. Shanley Jr.
THEIR ATTORNEY.

Nov. 18, 1969 D. J. SIEBOLD ET AL 3,478,718

UHF-VHF CHANNEL INDICATING DEVICE

Filed Dec. 2, 1966 2 Sheets-Sheet 2

INVENTORS:
DONALD J. SIEBOLD,
MICHAEL L. CALLAHAN,

BY W. J. Shanley Jr.
THEIR ATTORNEY.

United States Patent Office 3,478,718

Patented Nov. 18, 1969

3,478,718

UHF-VHF CHANNEL INDICATING DEVICE

Donald J. Siebold, North Syracuse, and Michael L. Callahan, Marcellus, N.Y., assignors to General Electric Company, a corporation of New York Filed Dec. 2, 1966, Ser. No. 598,795

Int. Cl. H03j *1/02*

U.S. Cl. 116—124.1 4 Claims

ABSTRACT OF THE DISCLOSURE

A combination UHF-VHF tuner channel indicating device having concentric indicator discs for indicating both the UHF and VHF channel selection at a single location and including concentric control shafts for effecting both coarse selection and fine tuning of the VHF channels, whereby VHF channel fine tuning can be effected without causing movement of the indicator discs.

This invention relates in general to an indicating device, and more particularly, to a combination television UHF-VHF channel indicating device.

With the advent of an increasing number of new UHF television stations, it has become incumbent upon the manufacturers of television receivers to provide for UHF reception. Consequently, UHF channel indicating devices must also be provided, in addition to conventional VHF channel indicating devices. While production of inexpensive channel indicating devices is still a primary requirement, the devices must allow for precise channel selection. The channel indicating devices should also be conveniently located on the set and be rather simple to operate so as to facilitate the comfort of the viewer.

It is an object of this invention to provide a channel indicating device which is easy to assemble and mount and relatively inexpensive to manufacture.

It is another object of this invention to provide a channel indicating device which indicates both UHF and VHF channel selection at a single predetermined position on the television receiver.

It is yet another object of this invention to provide a combination UHF-VHF channel indicating device including a novel mechanism to effect both coarse selection and fine tuning of VHF stations.

A channel indicating device constructed in accordance with one aspect of the invention includes a VHF channel indicating disc fixed on a rotatable VHF coarse tuning or selector shaft adapted, also, for fine tuning. VHF channel members are imprinted on an outer annular portion of the disc, which disc portion also includes an aperture therein. A UHF channel indicating disc including UHF channel members imprinted on an outer annular portion thereof is disposed concentric with the VHF coarse tuning shaft and adjacent the VHF channel indicating disc. The UHF channel indicating disc is geared to a UHF coarse tuning shaft which may also be adapted for fine tuning.

The VHF coarse tuning shaft may be rotated so that a desired VHF channel member on the VHF channel indicating disc appears at a predetermined position exposed to the viewer. Fine tuning of the VHF channel may be accomplished so that no movement is imparted to the VHF channel indicating disc through the gear transmission arrangement of applicants' invention. Alternately, UHF channel selection is implemented by preliminary location of the VHF channel indicating disc so that the aperture thereof is at the exposed position, thereby exposing the UHF channel indicating disc to the viewer. The UHF coarse tuning shaft may then be rotated until a desired UHF channel member is located at the exposed position.

The invention will be better understood from the following description taken in conjunction with the accompanying drawings in which.

Figure 1:
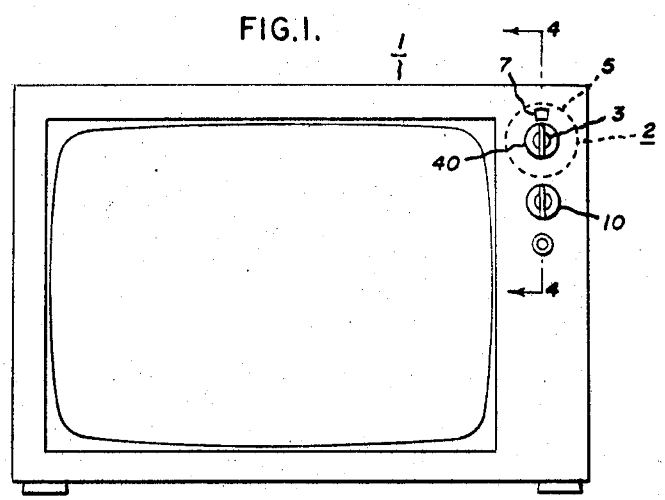
FIGURE 1 illustrates a television receiver employing the present invention.
Figure 2:
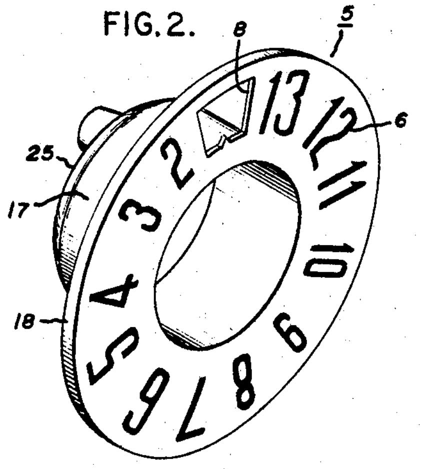
FIGURE 2 is a perspective view of the VHF channel indicating disc of the present invention.
Figure 3:
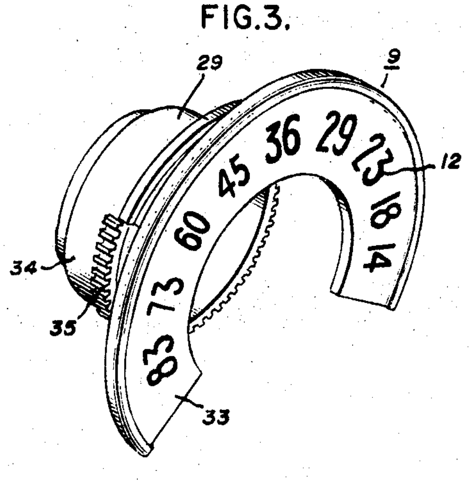
FIGURE 3 is a perspective view of the UHF channel indicating disc of the present invention.

With reference to the drawings, particularly FIGURES 1–4, the front panel of the television receiver 1 which employs both UHF and VHF tuners includes the UHF–VHF channel indicating device 2 of the instant invention. A VHF channel may be selected by rotation of a suitable knob 3 fixed on the VHF coarse tuning shaft 4. Rotation of the knob 3 causes the coarse tuning shaft 4 to rotate, thereby resulting in the shaft 4 driving a suitable element (not shown) in the VHF tuner to obtain the proper channel, and further resulting in the rotation of the VHF channel indicating disc 5 until the desired channel member 6 appears at a preselected position 7 on the front panel. An aperture 8 is included on a peripheral portion of the channel indicating disc.

When a particular UHF channel is desired, the VHF channel indicating disc 5 is first rotated so that the aperture 8 therein is disposed at the predetermined position 7, thereby exposing a UHF channel indicating disc 9 which is behind the VHF channel indicating disc 5. Rotation of the UHF channel selection knob 10 connected to the UHF coarse tuning shaft 11 results in rotation of the UHF channel indicating disc 9 until a desired channel member 12 appears at the predetermined position and is viewable through the aperture 8.

The invention will now be described with more specificity. A support frame 19 connected to the receiver is provided from which an end portion of the VHF coarse tuning shaft extends, which end portion includes the channel selection arrangement of the invention. The VHF coarse tuning shaft 4 is provided with a freely journalled spur gear 13 thereon. A fine tuning shaft 14 comprising a generally hollow cylindrical member 15 and including a spur gear portion 16 is freely journalled on the VHF tuning shaft 4. The fine tuning shaft 14 includes a suitable control knob 40 at an end thereof, and which may be integral therewith, for rotating the shaft 14.

The VHF channel indicating disc 5 is fixed on the coarse tuning shaft 4 for rotation therewith. The disc 5 is interposed between a fine tuning shaft gear portion 16 and the spur gear 13, and includes a cup-shaped member 17 having an annular flanged portion 18 extending from the rim thereof and a web 25. The flanged portion 18 includes the aperture 8 therein and a plurality of channel indicating numbers 6 spaced thereabout. The channel indicating disc 5 is preferably constructed of molded plastic.

Figures 4, 5:
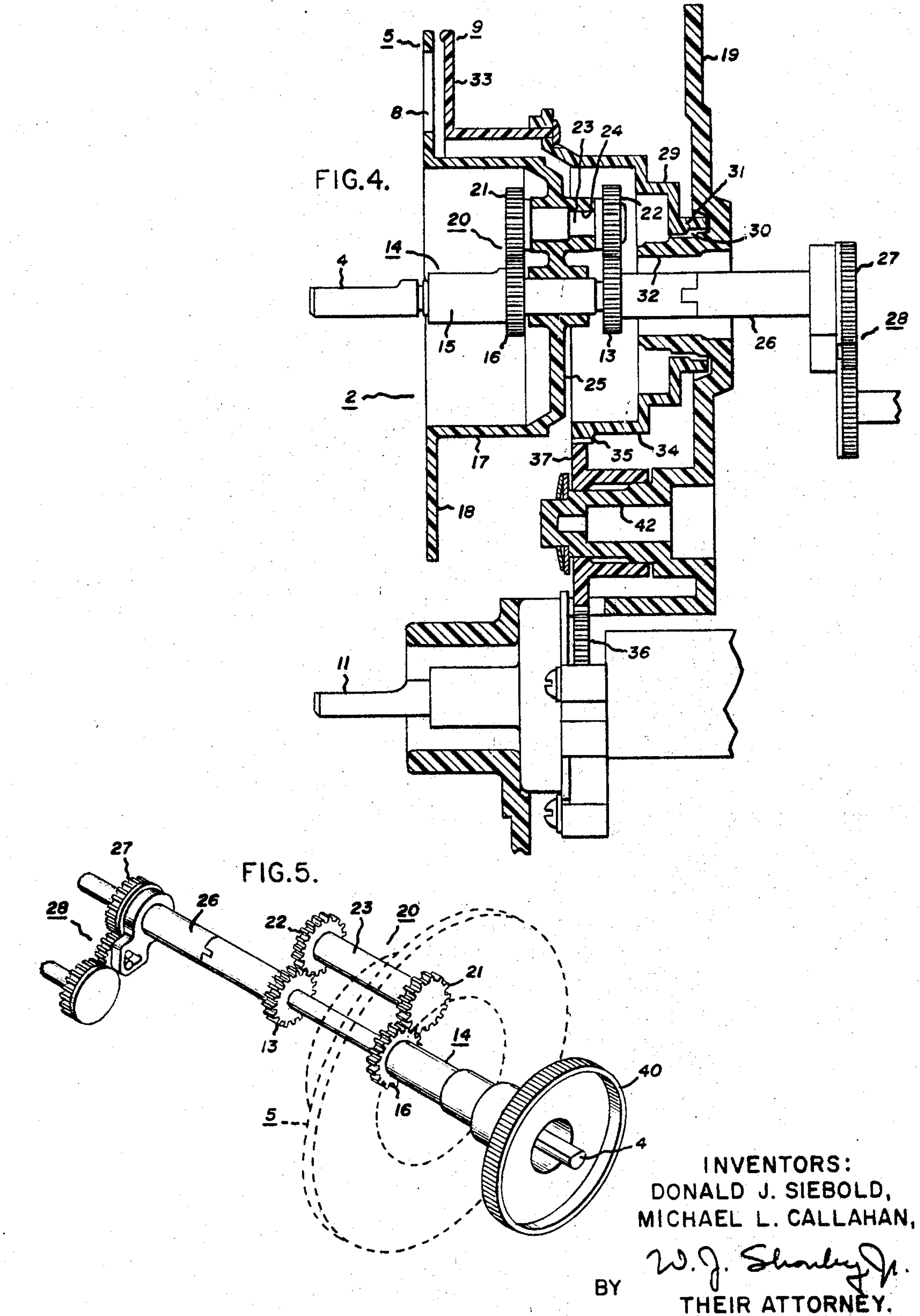
FIGURE 4 is a sectional view of the invention taken along lines 4—4 of FIGURE 1.
FIGURE 5 is a perspective view of the VHF fine tuning mechanism.

A novel VHF fine tuning mechanism is also provided and is best shown in FIGURES 4 and 5. The gear 16 on the fine tuning shaft 14 is connected through a gear transmission arrangement 20 carried by the VHF channel indicating disc 5 to the spur gear 13 freely journalled on the VHF coarse tuning shaft 4. The gear transmission arrangement 20 comprises first spur gear 21 and second spur gear 22 connected by means of cylindrical rod or pin 23 which is freely journalled in an eccentricly located aperture 24 in the web 25 of cup-shaped member 17. The first gear 21 of the gear transmission arrangement 20 is engaged by the gear portion 16 of the fine tuning shaft 14. The second gear 22 of the gear transmission arrangement 20 engages freely journalled gear 13. Thus, rotation of the fine tuning shaft 14 results in rotation of gear 13. Since the diameters of gear portion 16 and gears 21, 22 and 13 are equal, it can be seen that no rotation of the VHF channel indicating disc 5 will occur when the fine tuning shaft 14 is rotated, the pin 23 merely rotating freely in aperture 24.

Gear 13 is connected to one end of a cylindrical hollow shaft member 26 which may be integral therewith, if desired, and which is freely journalled on the coarse tuning shaft 4. The cylindrical shaft 26 is connected at the other end thereof to an output gear 27 freely journalled on the coarse tuning shaft 4. The output gear 27 engages a reduction gear system 28 drivingly connected to a VHF tuner (not shown), which system 28 may be of conventional structure and operation and which forms no part of the present invention.

It can be seen that when the VHF coarse tuning shaft 4 is caused to rotate by manual manipulation of the VHF channel selection knob 3, gear transmission arrangement 20 moves with the VHF channel indicating disc 5, since first gear 21 will planetate about gear portion 16, second gear 22 will planetate about gear 13, and pin 23 will freely rotate in the aperture 24 of web portion 25.

The UHF channel indicating disc 9 comprises a generally cup-like member 29 having a central aperture 30 formed in a cylindrical flanged portion 31 mounted for free rotation about a shaft 32 extending from the support frame 19. The disc 9 may be molded of plastic in a preferred form. The disc includes an outer annular peripheral flanged portion 33 having a number of spaced channel indicating numbers 12 imprinted thereon. In a preferred embodiment the flanged portion 33 does not extend entirely around cup-like member 29, but need be only sufficiently dimensioned to include the entire range of UHF channels. The flanged portion 33 of the UHF channel indicating disc 9 is disposed parallel to and adjacent the flanged portion 18 of the VHF channel indicating disc 5. An external surface 34 of the cup-like member 29 of the UHF channel indicating disc 12 includes gear portion 35. A UHF tuning shaft 11 is provided which may include suitable means for both coarse and fine tuning the UHF tuning shaft 11 is connected to the external gear portion 35 of the UHF channel indicating disc 9 so that rotation of the UHF tuning shaft 11 to a desired channel results in corresponding rotation of UHF channel indicating disc 9 until the desired channel number 12 appears at the predetermined position 7 and is viewable through the aperture 8 of the VHF channel indicating disc 5. In a preferred form, the UHF tuning shaft 11 includes a spur output gear 36 drivingly connected to the UHF channel indicating disc 9 through an idler gear 37 rotatably mounted on a shaft 42 extending from the support frame 19. The gear portion 36 of the tuning shaft 9 may directly engage the external gear portion 35 of the UHF channel indicating disc 9, if desired.

The two UHF and VHF channel indicating discs may include concentric channel indicating flanged portions so that the channel members on the UHF channel indicating disc will always be visible. The device would operate substantially the same. The VHF coarse tuning shaft would first be rotated to allow for UHF reception before the UHF tuning shaft would be used. Other equivalent arrangements are also possible.

I have thus described a UHF-VHF channel indicating device for a television receiver wherein a VHF channel indicating disc is directly driven by the VHF coarse tuning shaft. A VHF fine tuning shaft, journalled on the VHF coarse tuning shaft is connected through a gear transmission arrangement carried by the VHF channel indicating disc to an output gear also journalled on the VHF coarse tuning shaft. The gear transmission arrangement allows the VHF fine tuning shaft and output gear to be rotated without rotation of the VHF channel indicating disc. A UHF channel indicating disc, driven by a suitable UHF tuning shaft, is rotatably mounted concentric with the VHF coarse tuning shaft and so cooperates with the UHF channel indicating mechanism that channel numbers on either disc may be clearly viewable when desired.

Although the invention has been described with specificity, it is the aim of the appended claims to cover all such modifications as fall within the true spirit and scope of this invention.

What is claimed and is desired to be secured by Letters Patent of United States is:

1. A combination UHF-VHF channel indicating device comprising:

(a) a coarse tuning shaft having a first gear freely journalled thereon;

(b) a fine tuning shaft freely journalled on said coarse tuning shaft;

(c) a first member including channel indicaing means thereon and fixed to said coarse tuning shaft for rotation therewith, said first member being interposed between said first gear and said fine tuning shaft;

(d) a gear transmission arrangement for drivingly connecting said fine tuning shaft with said first gear on said coarse tuning shaft, whereby rotation of said fine tuning shaft imparts no rotary motion to said first member;

(e) output means for effecting fine tuning being freely journalled on said coarse tuning shaft and connected to said first gear;

(f) a second member having a plurality of second channel indicating means thereon, said second member concentric with said coarse tuning shaft so as to be freely rotatable thereabout; and (g) a second tuning shaft drivingly connected to said second member for rotation thereof.

2. A combination UHF-VHF channel indicating device comprising:

(a) a coarse tuning shaft having a first gear freely journalled thereon;

(b) a fine tuning shaft including a gear portion and being freely journalled on said coarse tuning shaft;

(c) a first member including channel indicating means thereon and fixed to said coarse tuning shaft for rotation therewith, said first member being interposed between said first gear and said fine tuning shaft;

(d) a gear transmission arrangement carried by said first member to drivingly connect the gear portion of said fine tuning shaft with said first gear on said coarse tuning shaft, whereby rotation of said fine tuning shaft imparts no rotary motion to said first member;

(e) output means for effecting fine tuning being freely journalled on said coarse tuning shaft and connected to said first gear;

(f) a second member having a plurality of second channel indicating means thereon, said second member being concentric with said coarse tuning shaft so as to be freely rotatable thereabout; and (g) a second tuning shaft drivingly connected to said second member for rotation thereof.

3. A combination UHF-VHF channel indicating device as recited in claim 2 wherein said first member includes an aperture spaced radially from said coarse tuning shaft and wherein said gear transmission arrangement comprises second and third gears connected by means of a pin freely journalled in said aperture in said first member, said second gear engaged by said fine tuning shaft gear portion and said third gear engaging said first gear journalled on said coarse tuning shaft, said first, second and third gears and said gear portion of said fine tuning shaft having equal outer diameters so that rotation of said fine tuning shaft drives said first gear while imparting no rotary motion to said first member.

4. A combination UHF-VHF channel indicating device as recited in claim 2 wherein said first member includes an annular flanged portion having an aperture therein and a plurality of first channel indicating means spaced thereon, whereby, upon rotation of said coarse tuning shaft, said aperture and any of said first channel indicating means may be caused to appear at a predetermined position, and wherein said second member includes an annular flanged portion having a plurality of second channel indicating means spaced thereon, said second member being adjacent said first member whereby, upon location of said aperture at said predetermined position, said second member is exposed and may be rotated so that any of said second channel indicating means may be caused to appear at said predetermined position and be viewable through said aperture.

References Cited

UNITED STATES PATENTS

| | | | |
|---|---|---|---|
| 2,909,934 | 10/1959 | Meadows | 74—10.45 |
| 3,179,907 | 4/1965 | Brand et al. | 334—1 |
| 3,196,695 | 7/1965 | Dotto | 71—10.41 |
| 3,285,078 | 11/1966 | Siebold | 74—10.8 XR |
| 3,370,473 | 2/1968 | Fisher | 74—10.8 |
| 3,376,846 | 4/1968 | Sekiguchi et al. | 116—124.1 |
| 3,393,657 | 7/1968 | Fukunishi | 116—124.1 |

LOUIS J. CAPOZI, Primary Examiner

U.S. Cl. X.R.

74—10.45; 325—464; 334—86